US007405580B2

United States Patent
Marinskiy

(10) Patent No.: US 7,405,580 B2
(45) Date of Patent: Jul. 29, 2008

(54) SELF-CALIBRATION IN NON-CONTACT SURFACE PHOTOVOLTAGE MEASUREMENT OF DEPLETION CAPACITANCE AND DOPANT CONCENTRATION

(75) Inventor: Dmitriy Marinskiy, Tampa, FL (US)

(73) Assignee: Semiconductor Diagnostics, Inc., Tampa, FL (US)

( * ) Notice: Subject to any disclaimer, the term of this patent is extended or adjusted under 35 U.S.C. 154(b) by 337 days.

(21) Appl. No.: 11/377,632

(22) Filed: Mar. 16, 2006

(65) Prior Publication Data

US 2006/0208256 A1    Sep. 21, 2006

Related U.S. Application Data

(60) Provisional application No. 60/662,320, filed on Mar. 16, 2005.

(51) Int. Cl.
   *G01R 31/26*    (2006.01)
(52) U.S. Cl. .................. 324/750; 324/752; 324/765
(58) Field of Classification Search .............. None
   See application file for complete search history.

(56) References Cited

U.S. PATENT DOCUMENTS

| | | | |
|---|---|---|---|
| 4,544,887 A | 10/1985 | Kamieniecki | |
| 4,812,756 A | 3/1989 | Curtis et al. | |
| 5,216,362 A | 6/1993 | Verkuil | |
| 5,661,408 A | 8/1997 | Kamieniecki | |
| 6,037,797 A * | 3/2000 | Lagowski et al. | .......... 324/766 |
| 6,803,588 B2 | 10/2004 | Kamieniecki | |

OTHER PUBLICATIONS

A. Goetzberger, E.H. Nicollian, "Transient Voltage Breakdown due to Avalanche in MIS Capacitors," Applied Physics Letters, vol. 9, No. 12, Dec. 15, 1966, 444-446.
A. Goetzberg and E.H.Nicollian "MOS Avalanche and Tunneling Effects in Silicon Surfaces" J. Appl. Phys. vol. 38 No. 12, pp. 4582-4588 (1967).
A. Rusu, C. Bulucea, "Deep-Depletion Breakdown Voltage of Silicon-Dioxide/Silicon MOS Capacitors," IEEE Transactions on Electron Devices, vol. ED-26, No. 3, Mar. 1979, 201-205.
D. Marinskiy, J. Lagowski, J. D'Amico, A. Findlay, L. Jastrzebski, "Non-contact Electrical Doping Profiling," *Characterization and Metrology for ULSI Technology*, edited by D.G. Seiler et al., AIP Conference Proceedings CP683, New York: American Institute of Physics, 2003, pp. 802-806.
R. Nakhmanson, "Frequency Dependence of the Photo-EMF of Strongly Inverted Ge and Si MIS Structures-I. Theory," Solid State Electronics, v. 18, p. 617-626 (1975).
S.M. Sze, "Avalanche Multiplication," *Physics of Semiconductor Devices*, Wiley, 1981, Chapter 2.
S.M. Sze, G. Gibbons, "Avalanche Breakdown Voltages of Abrupt and Linearly Graded p-n junctions in Ge, Si, GaAs, and GaP," Applied Physics Letters, vol. 8, No. 5, Mar. 1, 1966, 111-113.

* cited by examiner

*Primary Examiner*—Minh N Tang
(74) *Attorney, Agent, or Firm*—Fish & Richardson P.C.

(57) ABSTRACT

The surface photovoltage dopant concentration measurement of a semiconductor wafer is calibrated by biasing the semiconductor wafer into an avalanche breakdown condition in a surface depletion region; determining a contact potential difference value corresponding to an avalanche breakdown; determining small signal ac-surface photovoltage value corresponding to an avalanche breakdown; and using the values of the contact potential and the surface photovoltage to calculate a calibration constant that relates depletion layer capacitance and an inverse of the surface photovoltage.

20 Claims, 5 Drawing Sheets

302 linear plot 304 logarithmic plot $V_{CPD}$ versus time for 10 Ohm-cm Boron doped Si wafer.

SELF-CALIBRATION IN NON-CONTACT
SURFACE PHOTOVOLTAGE MEASUREMENT
OF DEPLETION CAPACITANCE AND
DOPANT CONCENTRATION

CROSS-REFERENCE TO RELATED APPLICATIONS

This application claims priority under 35 U.S.C. § 119 to U.S. Provisional Patent Application 60/662,320, filed Mar. 16, 2005, which is incorporated herein by reference.

TECHNICAL FIELD

This disclosure relates to self-calibration in non-contact surface photovoltage measurement of depletion capacitance and dopant concentration.

BACKGROUND

To achieve the electrical properties of a semiconductor needed for integrated circuits, dopants are added to the semiconductor material that changes its intrinsic electrical properties. Control of dopant concentration in the near surface region is important in semiconductor manufacturing, especially in epi-technology and ion implantation.

SUMMARY

In general, in one aspect, the surface photovoltage dopant concentration measurement of a semiconductor wafer is calibrated by biasing the semiconductor wafer into an avalanche breakdown condition in a surface depletion region; determining a contact potential difference value corresponding to an avalanche breakdown; determining small signal ac-surface photovoltage value corresponding to an avalanche breakdown; and using the values of the contact potential and the surface photovoltage to calculate a calibration constant that relates depletion layer capacitance and an inverse of the surface photovoltage.

Implementations may include one or more of the following features. The semiconductor wafer is biased into the avalanche breakdown condition by generating a corona charge in the vicinity of the semiconductor wafer. The corona charge is generated by a corona electrode. The contact potential at avalanche breakdown is determined by monitoring a decay of a contact potential and extrapolating a value of the contact potential to an earlier time. The contact potential is determined with a probe. The earlier time is a time at which the avalanche breakdown condition occurred. The surface photovoltage at avalanche breakdown is determined by measuring a decay of a surface photovoltage and extrapolating a value of the surface photovoltage to an earlier time. The surface photovoltage is determined with a probe. A calibration constant is calculated by using the contact potential at avalanche breakdown to calculate a doping concentration, using the doping concentration to calculate a depletion capacitance at avalanche breakdown, and using the depletion capacitance at avalanche breakdown and the surface photovoltage at avalanche breakdown to calculate the calibration constant. The calibration constant is calculated by a processor.

Other general aspects include other combinations of the aspects and features described above and other aspects and features expressed as methods, apparatus, systems, program products, and in other ways.

Advantages include the ability to determine the dopant concentration of a semiconductor wafer without any damaging contact to the wafer. The calibration constant that is needed for such a measurement with the surface photovoltage technique is determined for each wafer as the wafer is actually measured rather than from a separate measurement on reference wafers that may not be representative of the wafers used in production.

Other advantages and features will become apparent from the following description and claims.

DETAILED DESCRIPTION

In a non-contact dynamic technique for dopant depth profiling, also referred to as non-contact DDP, two voltage signals are simultaneously monitored versus time during a collapse of non-equilibrium deep depletion after corona charging of the wafer surface with appropriate polarity ions, i.e., positive ions for p-type and negative ions for n-type semiconductors, respectively. This process can be improved with a self-calibration feature that is realized during the actual wafer measurement cycle, rather than by employment of a special calibration wafer used solely for calibration purposes. Such a method is disclosed, for example, in D. Marinskiy, J. Lagowski, J. D'Amico, A. Findlay, L. Jastrzebski, "Non-contact Electrical Doping Profiling," *Characterization and Metrology for ULSI Technology*, edited by D. G. Seiler et al., AIP Conference Proceedings CP683, New York: American Institute of Physics, 2003, pp. 802-806, which is hereby incorporated by reference.

One of the measured signals is the ac-surface photovoltage, $V_{SPV}$, generated by periodically modulated light. This signal is inversely proportional to the depletion layer capacitance, $C_D$. The purpose of calibration is to determine the proportionality constant that relates the capacitance to the $V_{SPV}$. This is realized by measuring the contact potential difference, $V_{CPD}$, that measures the voltage drop across the depletion layer, $V_D$. The calibration constant is obtained using two simultaneously determined values, $V_{SPV}$ and $V_{CPD}$ under a condition of deep depletion, limited by avalanche breakdown, created on a semiconductor by a high dose of corona charge placed on the surface.

Figure 1:
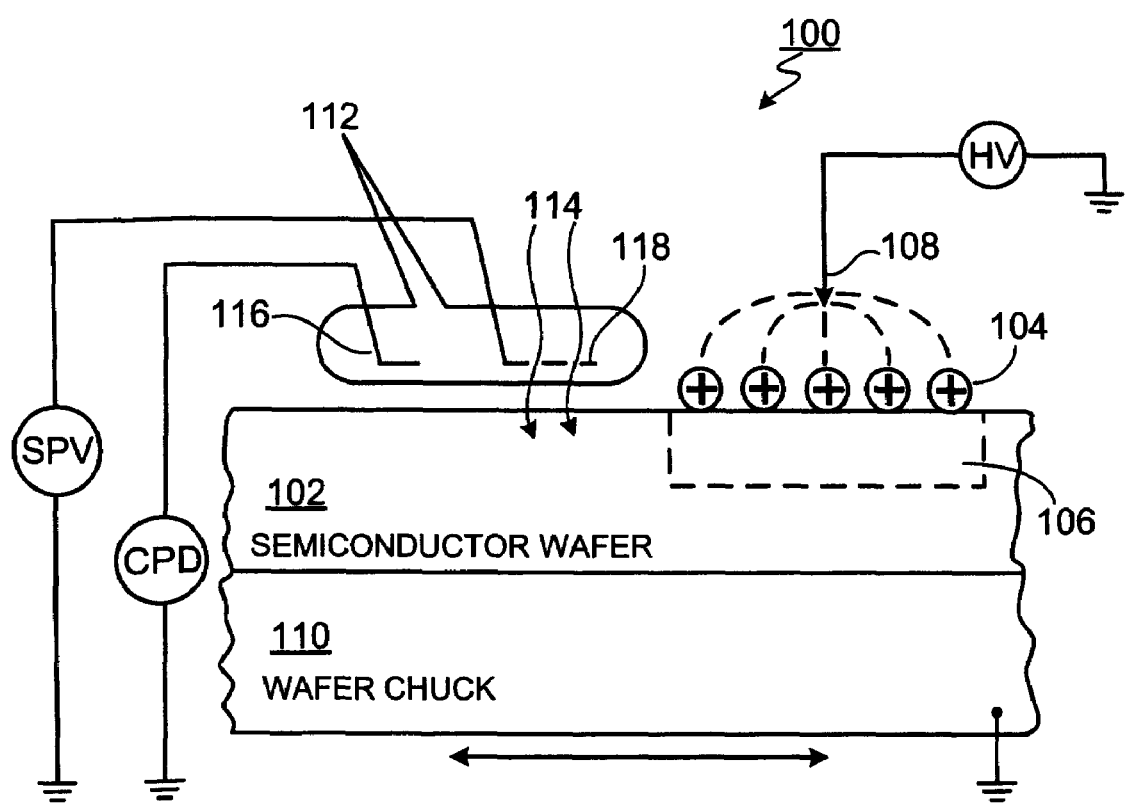
FIG. 1 is a schematic of an apparatus for non-contact surface measurement.

Referring to FIG. 1, a system 100 for doping measurement that incorporates the self-calibration is shown. In general, the system 100 includes a wafer 102 held in place by a moveable wafer chuck 110 that is electrically connected to the ground. The wafer 102 is doped with a concentration, $N_A$, of dopant atoms. A corona electrode 108 is used to deposit a large pulse of corona charge 104 on the wafer surface area, creating an avalanche-breakdown-limited deep depletion region 106 beneath the area where corona charge was deposited. Immediately after ceasing the charge deposition, the wafer is moved (by moving the wafer chuck 110) to position the charged area under the measuring probe assembly 112 that contains the surface photovoltage probe 118 and the contact potential probe 116. A transparent surface photovoltage probe 118 is used to measure the small-signal alternating-current surface photovoltage, $V_{SPV}$, generated by light 114, that passes through the probe 118 and is absorbed in the wafer 102 within a small light penetration depth beneath the surface. A vibrating Kelvin probe 116 is used to measure the contact potential difference, $V_{CPD}$. In assembly 112, two separate probes measure $V_{SPV}$ and $V_{CPD}$ in close proximity to each other. It is also possible to use one probe for simultaneous measurement of both signals. In this example, the CPD probe is appropriately configured to allow illumination of the wafer under the probe to generate an SPV signal.

A decay of $V_{CPD}$ after charging is monitored with the CPD probe 116 (for example the Kelvin probe or the Monroe probe). The CPD probe 116 operates at a frequency, $f_1$, that can be as low as about 10Hz or as high as about 300 kHz, depending on the design of the probe. In some embodiments, a probe with a frequency of about 1 kHz or higher is used because the higher frequency allows higher measuring speed. The $V_{CPD}$ decay gives a depletion voltage, $V_D = V_{CPD} - V_{off}$, where $V_{off}$ is the offset voltage. Simultaneously with $V_{CPD}$, the decay of small signal ac-surface photovoltage is measured. This depletion voltage decreases with time due to the depletion layer collapsing by minority carriers (electrons or holes) thermally generated in the semiconductor. $V_{SPV}$ is generated by low intensity, monochromatic light 114 that is modulated at a frequency, $f_2$, of about 10 kHz. Photon energy, h v, of the light 114 should be high enough to ensure short penetration depth of light into the wafer. For a silicon wafer, light with h v of about 2.6 eV(or a wavelength of 475 nm) corresponds to light penetration below 1 micrometer. The light modulation frequency should be high, so that the magnitude of $V_{SPV}$ decreases linearly with increasing light modulation frequency. For Si wafers, $f_2$ may be set to around 10 kHz. The surface photovoltage is the light-induced voltage that is generated in a semiconductor and is detected by a semitransparent electrode 118 placed in the proximity of the semiconductor surface. $V_{SPV}$ is measured using a lock-in amplifier that enables one to monitor the imaginary component of the alternating-current SPV signal, Im $V_{SPV}$.

For a short light penetration depth and high light modulation frequency, (such as $f_2 \cong 10$ kHz or higher), the Im $V_{SPV}$ becomes inversely proportional to the depletion layer capacitance, $C_D$, (for example, see R. Nakhmanson, Solid State Electronics, v. 18, p. 617-626 (1975)). The corresponding relation:

$$C_D = \text{const.} \frac{I_{eff}}{\omega \cdot \text{Im} V_{SPV}} \quad (1)$$

can be employed to calculate the capacitance value from the measured Im $V_{SPV}$, providing that the proportionality constant "const" is known. This constant depends upon experimental variables such as the distance between the SPV probe 118 and the wafer 102, the light intensity, $I_{eff}$, and the modulation frequency, $f_2$, and also on the semiconductor material properties and especially on the semiconductor surface condition that can change the fraction of light entering the semiconductor. The surface condition depends upon surface preparation (polishing, etching) and on specific surface coatings (oxide and other dielectric films) used in manufacturing of semiconductor integrated circuits. Therefore, the proportionality constant in Eq. 1 cannot be treated as universal, but rather is dependent on the semiconductor wafer. In previous non-contact surface photovoltage (SPV) measurements the calibration, (i.e., the determination of the constant in Eq. 1) was typically performed using one or more reference wafers with a range of known dopant concentrations. The constant was obtained from a known depletion layer capacitance and a measured $V_{SPV}$ signal. Such calibration generates reliable results only for wafers having exactly the same surface preparation and the same surface optical properties (reflectivity and scattering). However, it leads to discrepancies when applied to wafers with surface conditions that are different from that of the reference wafers. This is a practical limitation for such non-contact doping measurements using reference wafers.

The system 100 is used to determine the value of the constant in Eq. 1 for each actually-measured wafer. This procedure is referred to as self-calibration and it is incorporated in a measuring cycle intended to determine the wafer dopant concentration value or the dopant concentration versus depth, i.e., the dopant depth profile. Determining the calibration constant in-situ avoids the need to rely on reference wafers, as the calibration constant for each wafer can be determined when the properties of that wafer are measured. Calibration of the SPV method for measuring the depletion capacitance, $C_D$, is based on creation of the avalanche breakdown condition by large dose corona charging. Under the breakdown condition, the relationship between the two measured signals, i.e., the $V_{CPD}$ and Im $V_{SPV}$, is expressed in terms of known breakdown equations. The calibration constant is then obtained from a solution of the corresponding set of equations.

Figure 2:
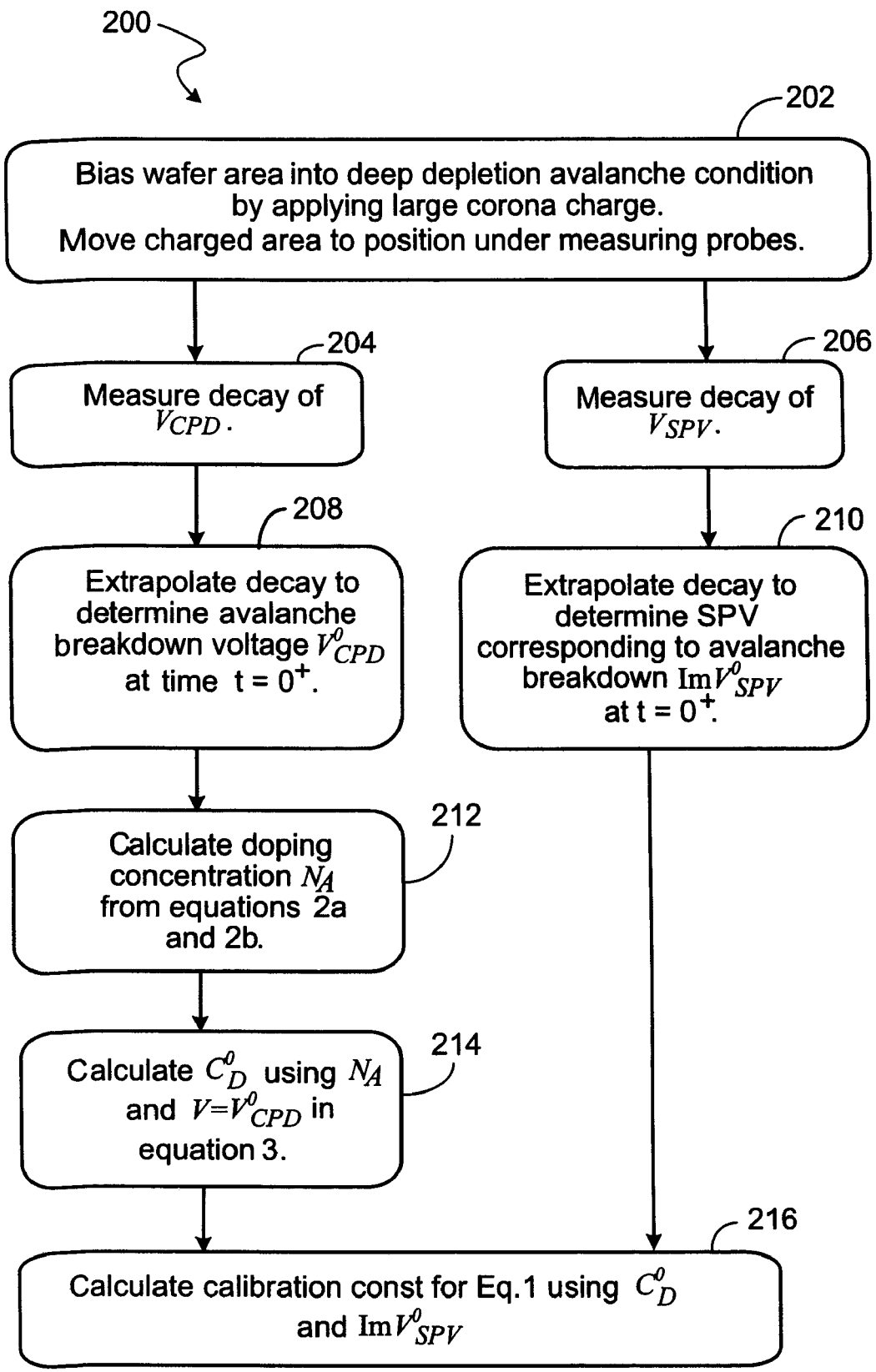
FIG. 2 is a flow chart.

As shown in FIG. 2, the self-calibration process 200 involves generation of avalanche breakdown in the depletion layer (202) at the onset of the measuring cycle, at time t=0. Avalanche breakdown occurs when voltage across the depletion region is great enough to accelerate free electrons to such a speed that upon striking an atom, they knock free additional electrons, which are in turn accelerated, continuing the "avalanche" of electrons. For a given semiconductor, the avalanche breakdown limits the maximum electric field, $E_m$, which the semiconductor can sustain. The corresponding depletion voltage (i.e., the breakdown voltage, $V_{BD}$) and the depletion width at the breakdown condition depend only on the semiconductor's dielectric constant, $\epsilon$, and its doping level, $N_A$. Avalanche breakdown is induced by applying a pulse of a large corona charge with the areal density, $Q_c$ (electric charge per cm$^2$). This total density of the corona charge, $Q_C$, in the charging pulse should be equal to or larger than the depletion space charge, $Q_{SC}$, at the avalanche voltage. Table 1 shows depletion layer parameters for silicon at the avalanche breakdown condition as a function of the semiconductor doping. In general, $Q_{SC}$ increases with increased doping levels. It should be noted that when $Q_C > Q_{SC}$, the corona charge in excess of the depletion space charge at breakdown is quickly neutralized by the avalanche breakdown current. This enables the use of the same large corona dose $Q_C > Q_{SC}$ for the entire range of wafers with different dopant concentrations. In one example, a corona charge dose of $Q_C \sim 1e13$ q/cm$^2$ was used for all measured wafers with doping range from 2e14cm$^{-3}$ to 5e16cm$^{-3}$. Accordingly, $Q_C > Q_{SC}$ for the entire range of dopant concentration.

TABLE 1

Depletion parameters in silicon at avalanche breakdown.

| Dopant Concentration, [cm$^{-3}$] | Breakdown Voltage, [V] | Depletion width at breakdown, [μm] | Depletion space charge $Q_{SC}$ [q/cm$^2$] |
|---|---|---|---|
| 2.0e14 | 1072 | 84.0 | 1.7e12 |
| 1.0e15 | 296 | 19.7 | 2.0e12 |

TABLE 1-continued

Depletion parameters in silicon at avalanche breakdown.

| Dopant Concentration, [cm$^{-3}$] | Breakdown Voltage, [V] | Depletion width at breakdown, [μm] | Depletion space charge Q$_{SC}$ [q/cm$^2$] |
|---|---|---|---|
| 1.0e16 | 53 | 2.6 | 2.6e12 |
| 1.0e17 | 12 | 0.4 | 3.9e12 |
| 5.0e17 | 6 | 0.1 | 6.1e12 |

As shown in Table 1, for low doping levels the breakdown voltage exceeds about 1000 V. Thus, in order to measure such voltages, a CPD probe with an appropriate large voltage range should be used.

The system 100 next measures the $V_{CPD}$ decay (204) to determine the avalanche breakdown voltage $V_{CPD}^0$ at time t=0$^+$(208). Simultaneous measurement (206) of the surface photovoltage decay 206 allows the determination of the value of the surface photovoltage, also at time t=0$^+$, when Im $V_{SPV}$=Im$V_{SPV}^0$.

Figure 3:
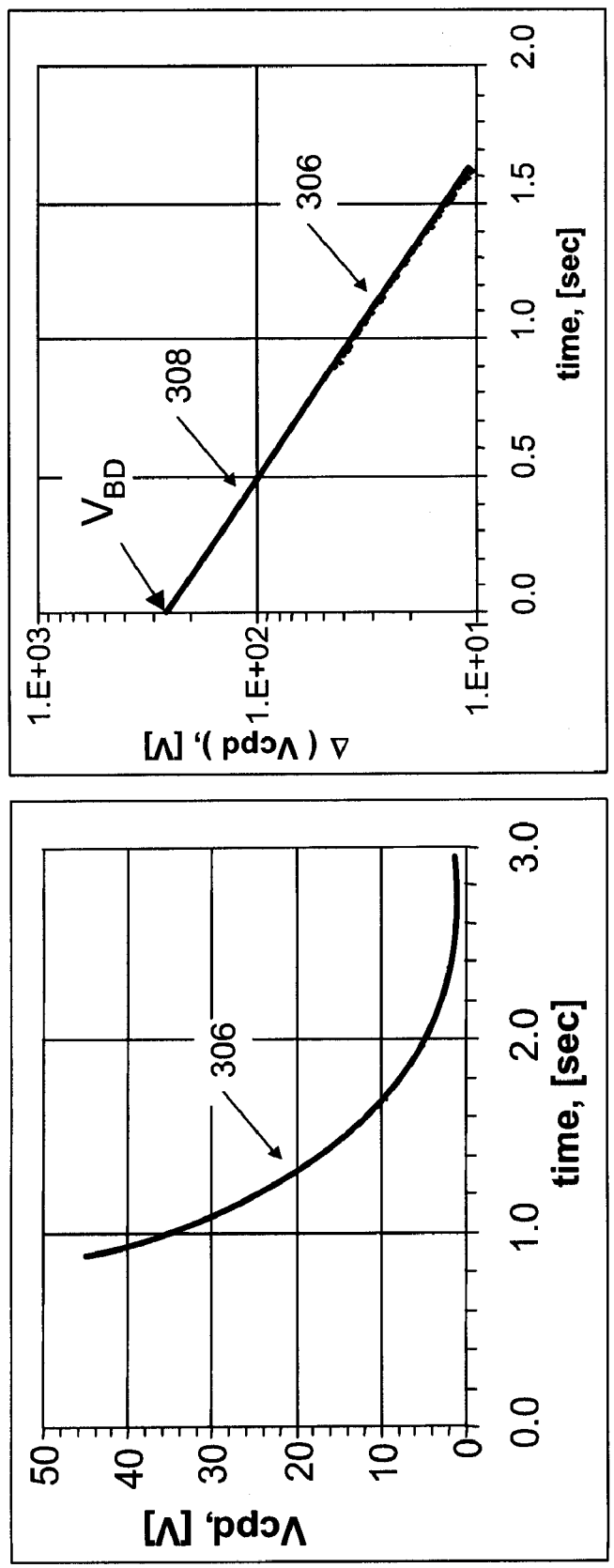
FIG. 3 is a graph of contact potential decay.

The voltages cannot be directly measured at time t=0 due to a delay time required to reposition the wafer 102 so that the charged region is under the measuring probes. As shown in FIG. 3, the measured values 306 of $V_{CPD}$ are extrapolated back to time t =0 to find the avalanche breakdown voltage $V_{BD}$=$V_{CPD}^0$. The linear plot 302 shows that the change in $\Delta V_{CPD}$=$V_{CPD(t)}$-$V_{CPD}$(t→∞) is an exponential function of time, such that ln ($\Delta V_{CPD}$) is linear function of time, as shown in the plot 304. From this, the breakdown voltage, $V_{BD}$, which equals the value of $\Delta V_{CPD}$ at time t=0, is easily found, as illustrated by a line 308 through the measured values 306 back to time t=0. Similar extrapolation is used to find Im $V_{SPV}^0$. Exponential time dependencies of the contact potential difference and of the surface photovoltage are well-known results of the minority carrier generation process within a collapsing depletion region.

The breakdown voltage value determined in 208 enables the calculation of the dopant concentration $N_A$ (212) from a set of two well-established empirical relations:

$$V_{CPD}^0 = V_{BD} = \frac{\varepsilon \cdot \varepsilon_0 \cdot E_m^2}{2 \cdot q \cdot N_A} \quad (2a)$$

and $$E_m = \frac{4 \cdot 10^5}{1 - \frac{1}{3} \cdot \log\left(\frac{N_A}{10^{16}}\right)} \quad (2b)$$

where $E_m$ is the maximum electric field. These equations are described, for example, in S. M. Sze, *Physics of Semiconductor Devices*, Wiley, 1981, Chapter 2.

Once the dopant concentration $N_A$ is determined in step 212, the corresponding value of depletion layer capacitance $C^{D0}$ at avalanche breakdown is calculated in step 214 by the a well-known depletion layer C-V relation given by the Schottky barrier relationship. To calculate $C_D^0$, Eq. 3 is used with the depletion barrier height V being replaced by the avalanche breakdown value $V_{CPD}^0$.

$$C_D^{-2} = \frac{2}{\varepsilon \cdot \varepsilon_0 \cdot q \cdot N_A} \cdot \left(V - \frac{kT}{q}\right) \quad (3)$$

In the final step 216 of the calibration, $C_D^0$ and Im $V_{SPV}^0$, are used to determine the calibration constant in Eq. 1,i.e., $$const = C_D^0 \cdot \text{Im} V_{SPV}^0 \cdot \frac{\omega}{I_{eff}}.$$

In some examples, the in-situ calibration can additionally introduce a new constant, $C_{CAL}$, which separates the experimental variables, namely the light intensity, $I_{eff}$ and the angular light modulation frequency, $\omega=2\pi f_2$:$C_{CAL}$=const·$\omega$/$I_{eff}$. This enables the determination of $C_D$ when experimental conditions are changed, for example to optimize the value of SPV signal.

APPLICATION EXAMPLE

This technique can be applied to both p-type and n-type silicon wafers, and wafers of other semiconductor materials. When measuring the bare wafers, i.e., without a dielectric layer on the surface, it is desired to passivate at room temperature, e.g., in a commercial ultra-violet-oxidation (UVO) chamber. This step enhances corona charge retention on the surface and enables corona charging to produce the avalanche breakdown condition.

Figure 4:
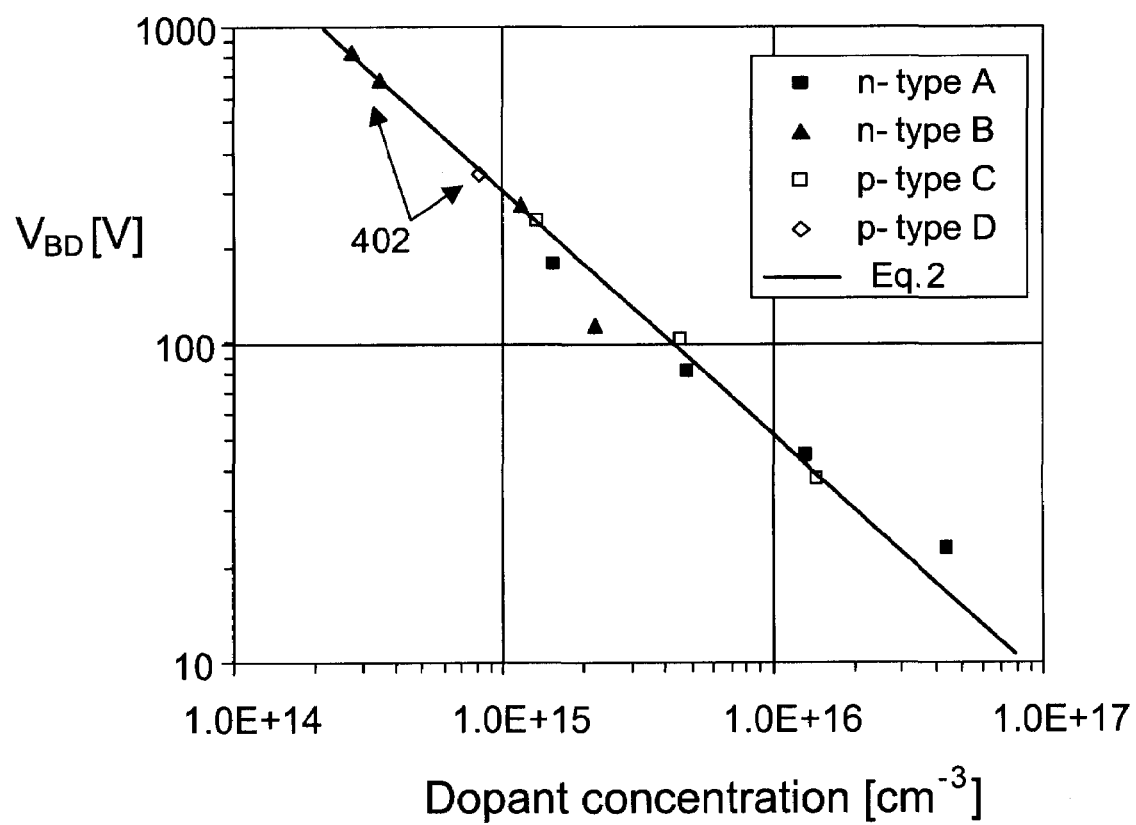
FIG. 4 is a graph of breakdown voltage.

The self-calibration process is based on the quantitative relationship between the avalanche breakdown voltage and the dopant concentration. It is therefore of importance to verify that the measurement of $V_{CPD}$ decay after corona charging gives the correct breakdown voltage values. Experimental results from one example using this process are shown in FIG. 4 for n-type and p-type wafers from different suppliers denoted as A, B, C and D. Dopant concentration values are according to specifications of the wafer suppliers. FIG. 4 shows that for over two orders of magnitude of concentration, the experimental values, determined from the $V_{CPD}$ transient as $V_{BD}$=$V_{CPD}^0$, follow the line calculated from Eqs. 2a and 2b. Special attention should be given to the samples 402 with concentration below 1.0e15cm$^{-3}$. Such samples often show edge electrical breakdown during conventional C-V profiling as disclosed, for example, in A. Goetzberger, E. Nicollian, *J. Appl. Phys.*, 38, 4582-4588 (1967). The edge electrical breakdown voltage is lower than the avalanche breakdown voltage. The experimental data below 1.0e15cm$^{-3}$ are on the avalanche breakdown line indicating no edge breakdown effect. This is not surprising since the system 100 as described above does not include an electrical contact. This is an advantage of the present dynamic C-V method over the conventional C-V method since it allows profiling deeper into the silicon.

Figure 5:
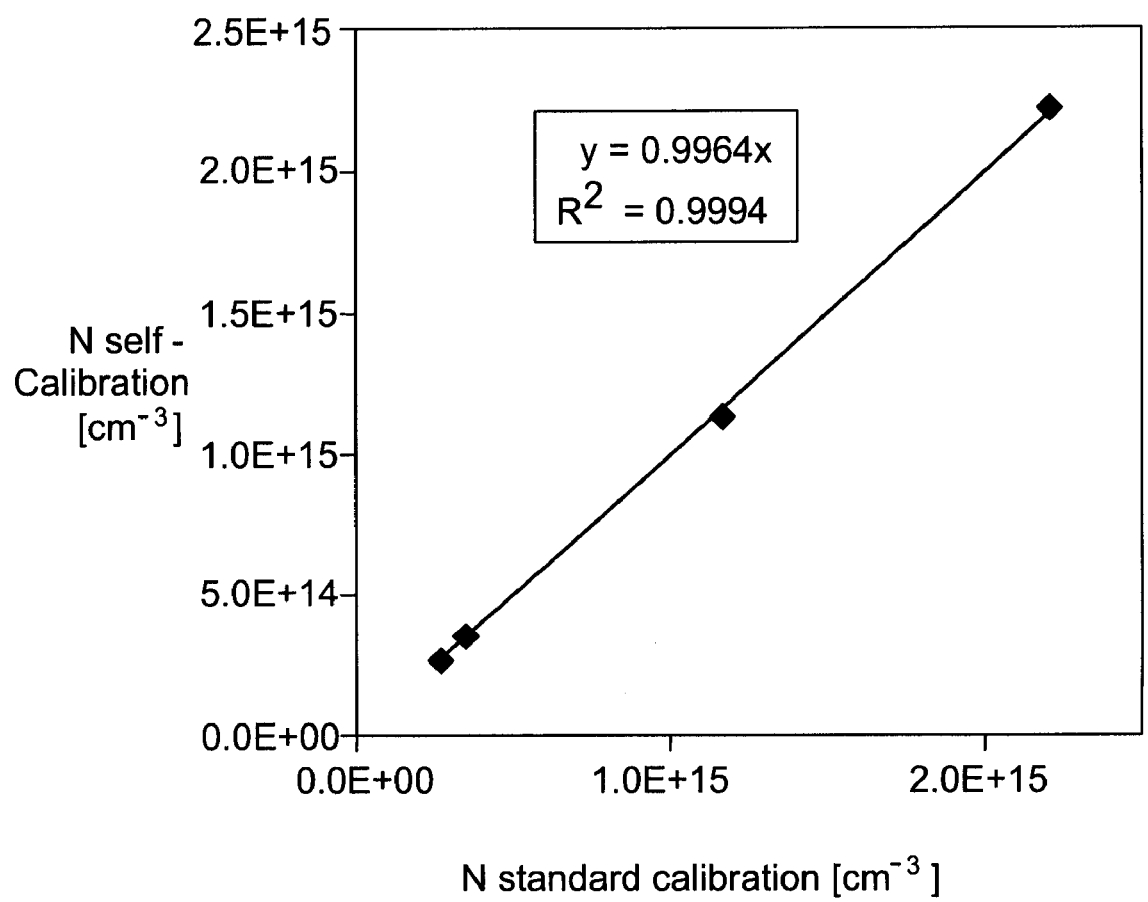
FIG. 5 is a graph comparing dopant concentrations determined with different methods.

Having confirmed the validity of the breakdown voltage measurement, the self-calibration was applied to non-contact doping measurement so that it could be compared with the results of doping measurement performed with standard calibration that is done employing four standard wafers with know dopant concentration and exactly the same surface preparation. After doping measurements with standard calibration were completed, the wafers were treated in a UVO chamber and the self-calibration measurement was performed. The results are given in FIG. 5. It is seen that the new method compares well with the standard calibration that confirms the validity of the new approach.

What is claimed is:

1. A method for calibrating the surface photovoltage dopant concentration measurement of a semiconductor wafer, the method comprising:
   biasing the semiconductor wafer into an avalanche breakdown condition in a surface depletion region;
   determining a contact potential difference value corresponding to an avalanche breakdown;
   determining small signal ac-surface photovoltage value corresponding to an avalanche breakdown; and
   using the values of the contact potential and the surface photovoltage to calculate a calibration constant that relates depletion layer capacitance and an inverse of the surface photovoltage.

2. The method of claim 1 wherein biasing the semiconductor wafer into the avalanche breakdown condition comprises generating a corona charge in the vicinity of the semiconductor wafer.

3. The method of claim 1 wherein determining the contact potential at avalanche breakdown comprises:
   monitoring a decay of a contact potential; and
   extrapolating a value of the contact potential to an earlier time.

4. The method of claim 3 wherein the earlier time is a time at which the avalanche breakdown condition occurred.

5. The method of claim 1 wherein determining the surface photovoltage at avalanche breakdown comprises:
   measuring a decay of a surface photovoltage; and
   extrapolating a value of the surface photovoltage to an earlier time.

6. The method of claim 5 wherein the earlier time is a time at which the avalanche breakdown condition occurred.

7. The method of claim 1 wherein calculating a calibration constant comprises:
   using the contact potential at avalanche breakdown to calculate a doping concentration,
   using the doping concentration to calculate a depletion capacitance at avalanche breakdown, and
   using the depletion capacitance at avalanche breakdown and the surface photovoltage at avalanche breakdown to calculate the calibration constant.

8. A system for calibrating a surface photovoltage dopant concentration measurement of a semiconductor wafer, the system comprising:
   a corona electrode configured to bias the semiconductor wafer into an avalanche breakdown condition in a surface depletion region;
   a first probe configured to determine a contact potential difference value corresponding to an avalanche breakdown;
   a second probe configured to determining small signal ac-surface photovoltage value corresponding to an avalanche breakdown; and
   a processor configured to use the values of the contact potential and the surface photovoltage to calculate a calibration constant that relates depletion layer capacitance and an inverse of the surface photovoltage.

9. The system of claim 8 wherein the corona electrode is further configured to generate a corona charge in the vicinity of the semiconductor wafer.

10. The system of claim 8 wherein first probe is configured to:
    monitor a decay of a contact potential; and
    the processor is configured to:
    extrapolate a value of the contact potential to an earlier time.

11. The system of claim 10 wherein the earlier time is a time at which the avalanche breakdown condition occurred.

12. The system of claim 8 wherein the second probe is configured to:
    measure a decay of a surface photovoltage; and
    the processor is configured to:
    extrapolate a value of the surface photovoltage to an earlier time.

13. The system of claim 12 wherein the earlier time is a time at which the avalanche breakdown condition occurred.

14. The system of claim 8 wherein the processor is further configured to:
    use the contact potential at avalanche breakdown to calculate a doping concentration,
    use the doping concentration to calculate a depletion capacitance at avalanche breakdown, and
    use the depletion capacitance at avalanche breakdown and the surface photovoltage at avalanche breakdown to calculate the calibration constant.

15. A computer program product tangibly embodied in an information carrier, the computer program product comprising instructions to cause a machine to:
    determine a contact potential difference value corresponding to an avalanche breakdown;
    determine small signal ac-surface photovoltage value corresponding to an avalanche breakdown,
    use the values of the contact potential and the surface photovoltage to calculate a calibration constant that relates depletion layer capacitance and an inverse of the surface photovoltage.

16. The computer program product of claim 15 , further comprising instructions to:
    determine the contact potential at avalanche breakdown by:
    extrapolating a value of the contact potential to an earlier time based on values corresponding to a monitored decay of a contact potential.

17. The computer program product of claim 15 wherein the earlier time is a time at which the avalanche breakdown condition occurred.

18. The computer program product of claim 15 further comprising instructions to cause a machine to:
    extrapolate a value of the surface photovoltage to an earlier time based on values corresponding to a measured decay of a surface photovoltage.

19. The computer program product of claim 18 wherein the earlier time is a time at which the avalanche breakdown condition occurred.

20. The computer program product of claim 15 further comprising instructions to cause a machine to:
    use the contact potential at avalanche breakdown to calculate a doping concentration,
    use the doping concentration to calculate a depletion capacitance at avalanche breakdown, and
    use the depletion capacitance at avalanche breakdown and the surface photovoltage at avalanche breakdown to calculate the calibration constant.

* * * * *

UNITED STATES PATENT AND TRADEMARK OFFICE
CERTIFICATE OF CORRECTION

PATENT NO. : 7,405,580 B2 Page 1 of 1
APPLICATION NO. : 11/377632
DATED : July 29, 2008
INVENTOR(S) : Dmitriy Marinskiy It is certified that error appears in the above-identified patent and that said Letters Patent is hereby corrected as shown below:

Column 8, line 35
In Claim 16, delete "15 ," and insert -- 15, --

Column 8, line 42
In Claim 17, delete "15" and insert -- 16 --

Signed and Sealed this

Eighteenth Day of November, 2008

JON W. DUDAS
*Director of the United States Patent and Trademark Office*